(12) United States Patent
Smith

(10) Patent No.: US 7,977,933 B2
(45) Date of Patent: Jul. 12, 2011

(54) HIGH VOLTAGE SENSOR CIRCUIT

(75) Inventor: Andrew L. Smith, Cape Coral, FL (US)

(73) Assignee: Griswold Water Systems, South Daytona, FL (US)

( * ) Notice: Subject to any disclaimer, the term of this patent is extended or adjusted under 35 U.S.C. 154(b) by 596 days.

(21) Appl. No.: 12/073,537

(22) Filed: Mar. 6, 2008

(65) Prior Publication Data

US 2009/0224774 A1 Sep. 10, 2009

(51) Int. Cl.
*G01R 23/00* (2006.01)
*B03C 5/02* (2006.01)
(52) U.S. Cl. ...................................... 324/76.51; 204/660
(58) Field of Classification Search ................. 324/76.51
See application file for complete search history.

(56) References Cited

U.S. PATENT DOCUMENTS

| | | | | |
|---|---|---|---|---|
| 5,032,839 | A * | 7/1991 | Even-Or | 342/15 |
| 5,171,228 | A * | 12/1992 | McDonald | 604/175 |
| 5,988,348 | A * | 11/1999 | Martin et al. | 194/317 |
| 6,084,682 | A * | 7/2000 | Zare et al. | 356/437 |
| 7,038,470 | B1 * | 5/2006 | Johnson | 324/664 |
| 7,524,413 | B2 | 4/2009 | Wittmer et al. | |
| 7,704,364 | B2 | 4/2010 | Merrill et al. | |
| 2004/0082884 | A1 * | 4/2004 | Pal et al. | 601/2 |
| 2007/0114164 | A1 | 5/2007 | Bradley et al. | |

OTHER PUBLICATIONS

Griswold Filtration; SBC Control—Scale, Bacteria & Corrosion Control-Electronic Precipitator System, Mar. 31, 2004; 21 pp.
Griswold Filtration; SBC Reaction Chamber Specification; SBC Driver with Internal User Interface, Apr. 2004; 1 p.
Griswold Filtration; SBC Installation/Operational Manual-Model SBC-10,10,000 INT, Sch. 80 PVC-RC; 2004; 6 pp.
Griswold Filtration; SBC Control—Scale, Bacteria & Corrosion Control-Consider the Benefits; Apr. 2004; 4 pp; Corona, CA.

* cited by examiner

*Primary Examiner* — Jeff Natalini
(74) *Attorney, Agent, or Firm* — Andrews Kurth LLP

(57) ABSTRACT

A microprocessor-controlled high voltage sensor circuit controls resonant operation of an induction coil—capacitor circuit. The sensor circuit includes an input that receives a high voltage signal from the induction coil—capacitor circuit, an attenuator coupled to the input, wherein the attenuator reduces the high voltage signal to a low voltage signal, a peak detector coupled to the attenuator, the peak detector that holds the low voltage signal and detects a peak value of the low voltage signal, a clipper circuit that limits an output voltage from the peak detector so as to prevent damage to components of the high voltage sensor circuit, and a linear amplifier that receives the low voltage signal from the clipper circuit and amplifies the low voltage signal for detection of resonance conditions in the induction coil—capacitor circuit by a microprocessor coupled to the high voltage sensor circuit.

13 Claims, 6 Drawing Sheets

HIGH VOLTAGE SENSOR CIRCUIT

TECHNICAL FIELD

The technical field is high voltage sensor circuits.

BACKGROUND

Many freshwater applications suffer degraded performance due to buildup of scale, bacteria and corrosion. Current water treatment systems focus on use of often harsh chemicals to limit the effects of this buildup. In addition, use of chemicals is time consuming and expensive. Chemicals must be added frequently, water chemistry monitored through frequent sampling and analysis, and periodic flushing, shocking and similar operations still are required. Even with the most sophisticated chemical treatment system, some scale buildup will occur, particularly in high temperature components such as heat exchangers and steam generators. Table 1 shows the impact of scale buildup on performance of a heat exchanger.

TABLE 1

Increase in Energy Consumption as a Function of Scale Thickness

| Scale Thickness (Inches) | Increased Energy Consumption (%) |
|---|---|
| 1/32 | 8.5 |
| 1/16 | 12.4 |
| 1/8 | 25 |
| 1/4 | 40 |

SUMMARY

What is disclosed is a high voltage sensor circuit (HVSC), support circuitry, and implementation algorithm for a method of self-tuning a high voltage resonant circuit in a microprocessor based water treatment device.

DESCRIPTION OF THE DRAWINGS

The detailed Description will refer to the following drawings in which like numerals refer to like items, and in which.

DETAILED DESCRIPTION

Figure 1:
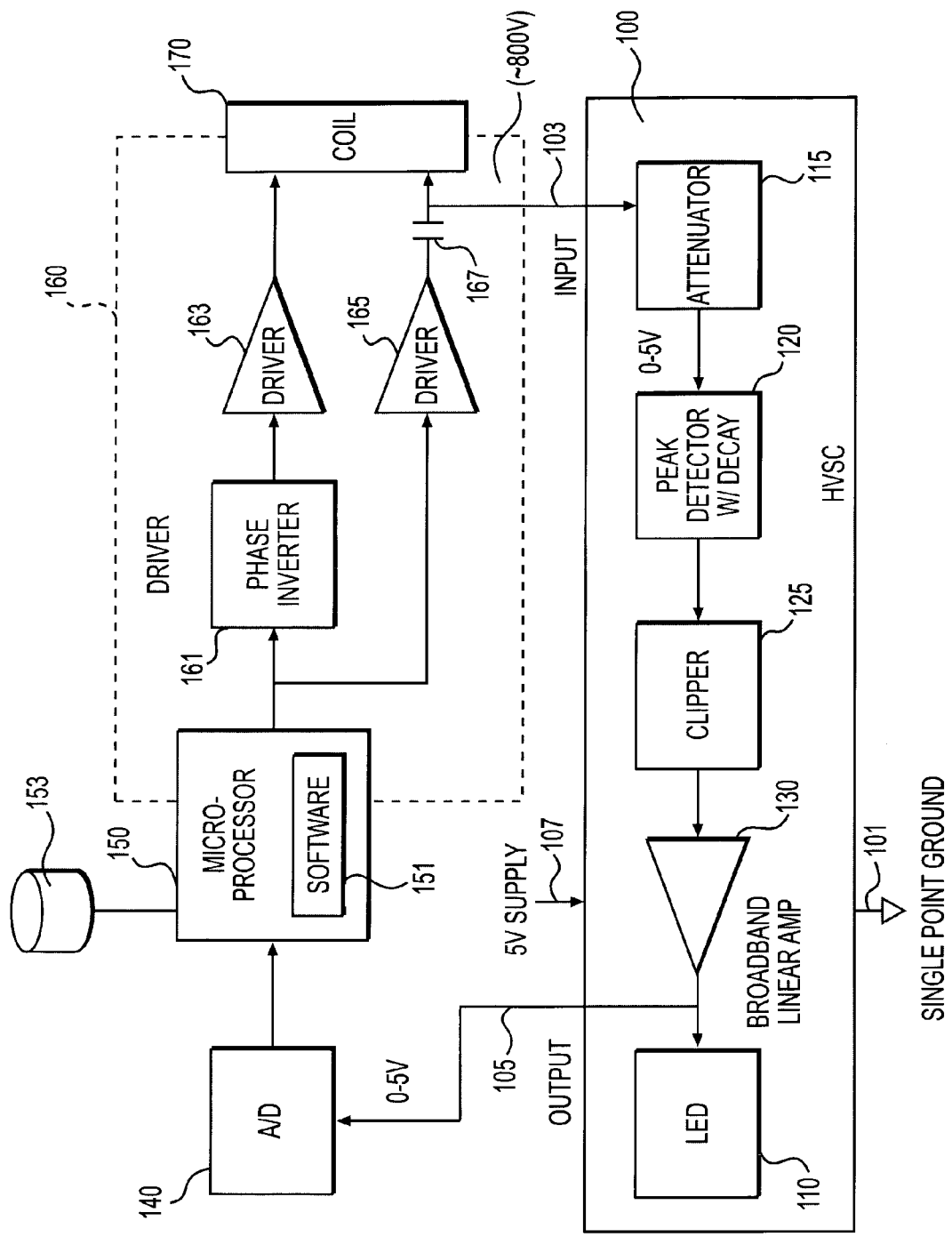
FIG. 1 is a block diagram of components of an exemplary high voltage sensor circuit and associated microprocessor and drive circuit.

In any freshwater system, scale, bacteria, and corrosion from the interaction of the freshwater and its system components can cause degraded performance and other problems. To prevent or minimize the buildup of these unwanted products and particles, a resonant water treatment system incorporating electronic precipitation and ultra-filtration is disclosed. This system uses a special purpose controller that applies a complex electronic signal to the water by way of an induction coil. Using this electronic precipitation system, problems inherent in chemical treatment systems are avoided. However, for such a resonant system, maintaining resonance is necessary for optimal system performance.

A Scale, Bacteria and Corrosion Controller (SBCC) generates the complex electronic signal that is applied to the water by way of the induction coil. The induction coil is housed, for example, in a Schedule 80 PVC reaction chamber. As water passes through the reaction chamber, the shape, size and net charge of the dissolved mineral crystals are altered. In this altered state, calcium and other hard water minerals do not precipitate in the normal fashion and adhere to system surfaces. The signal produced by the SBCC provides nucleation sites in the water that force minerals to precipitate in solution, thereby forming larger colloidal particles that can be removed by filtration or blowdown. In addition, natural hydrogen bonds between water molecules are fractured, which results in reduced water surface tension and greater solubility. The improved solubility of the treated water allows existing mineral encrustations to gradually re-hydrate and soften sufficiently to be removed by water flow, restoring heat exchanger efficiency without harsh chemical treatments.

The SBCC controls bacteria and algae in two ways. First, many organisms will bind up in colloidal mineral particles and be removed by filtration or blowdown. Second, the SBCC signal has sufficient power to damage bacteria cell walls, thereby rendering the bacteria incapable of reproduction. Microbial populations are controlled well below industry standards and may be further diminished due to electropuration caused by the SBCC signal The maximum energy transfer of oscillating energy between two mediums occurs at resonant frequencies of one medium or the other or of both mediums. Sustaining a resonant frequency over time provides the maximum transfer of energy over time. However, the physical properties that make the transfer practical can be subject to direct and indirect variations compromising optimal energy transfer. For example, temperature can cause expansion, which changes the frequency of resonance of one medium or the other, and under a fixed frequency system, energy transfer can be compromised. Furthermore, operating frequencies can vary due to component properties such as linear ranges and thermal sensitivities, also compromising energy transfer. For maximum power transfer in a resonant system, it is important to assess the natural resonance of the medium(s) and sustain operation at resonance over time. To account for these affects, a self-tuning resonant circuit is disclosed. The circuit is controlled so that an optimum resonant frequency is developed, where the optimum frequency corresponds to a peak power generation in the induction coil. The power output of the induction coil then is monitored to ensure the peak power condition is maintained, or if the peak power degrades, action can be taken to restore optimum operation.

The herein disclosed water treatment system provides for the generation of microprocessor controlled varying electromagnetic fields about at least one of several coils through which water flows. Although variations are possible, for this system, the mean frequency about which any of the electromagnetic fields vary is determined by an initial Scanning Phase under control of a microprocessor. The same microprocessor is used to excite the coils through drivers, and each coil is connected to a high voltage sensor circuit (HVSC). During this Scanning Phase, the HVSC is used to detect resonance and determine its frequency. The HVSC also is used to detect energy transfer, during a second, or Normal Run Phase, of the microprocessor to enhance the function of the water treatment device. The microprocessor can alternate between the Scanning and Normal Run phases and can also incorporate both phases into a single algorithm.

The microprocessor produces signals that are amplified and used to control varying currents passing through coils through which water flows. The amplification may be modulated. During the Normal Run Phase, the frequencies determined during the Scanning Phase are sustained as mean frequencies. For some coils, the mean frequency may be preset in hardware and/or software; for other coils the mean frequency may be determined from values read from an A/D converter in conjunction with the HVSC, the microprocessor, and the microprocessor's associated software. These mean frequencies are related to the resonant frequencies of the coil being monitored. The same HVSC, microprocessor and the microprocessor's associated software is used during the Normal Run Phase as a means of checking the performance of the coil. During this latter phase, the HVSC is used as an energy level detector.

FIG. 1 is a diagram of an embodiment of a HVSC 100 and associated microprocessor 150, memory 153, and drive circuit 160 for use in the SBCC. The HVSC 100 has a single point common ground 101, a signal input 103 for signal voltages up to over one thousand volts DC as well as AC, a signal output 105, for up to 5 VDC, a 5 VDC voltage supply 107, and a proportional optical output in the form of a high efficiency LED 110. The signal input 103 is such that the signal input 103 may be wired directly to a high voltage node of the SBCC, which is usually a terminal to a coil being monitored, while at the same time resisting damage due to high voltage. The signal output 105 is such that the signal output 105 may be wired directly to a 5V A/D converter 140, which is accessed directly by the 5 VDC microprocessor 150. The transfer function of the HVSC 100 is such that the output 105 is linear and proportional to the input 103 up to a limit, at which point the output 105 remains at a terminal value as the input 103 voltage continues to increase within a broad frequency range that includes DC. The relative brightness of the LED 110 reflects the signal output linearly and also remains at a high brightness as the signal input 103 voltage meets and exceeds a certain limit, such as, for example, 1000 VDC. The transfer function also incorporates a peak level detector and storage device with decay so as to assure that the input signal duty cycle will have little impact on the output signal when the input is above a threshold frequency determined by the decay rate of the peak detector, for example, 1000 Hz. The bandwidth of the HVSC 100 is sufficient for high frequency water treatment. For example, upper frequency operation of at least 80,000 Hz has been tested, and will allow for the detection and transfer of peak values independent of duty cycle within the frequency range of the two limits (1000 Hz and 80,000 Hz), but also including DC. The output 105 of the HVSC 100 normally is wired to the A/D converter 140, which can be monitored directly by the microprocessor 150.

Figure 2:
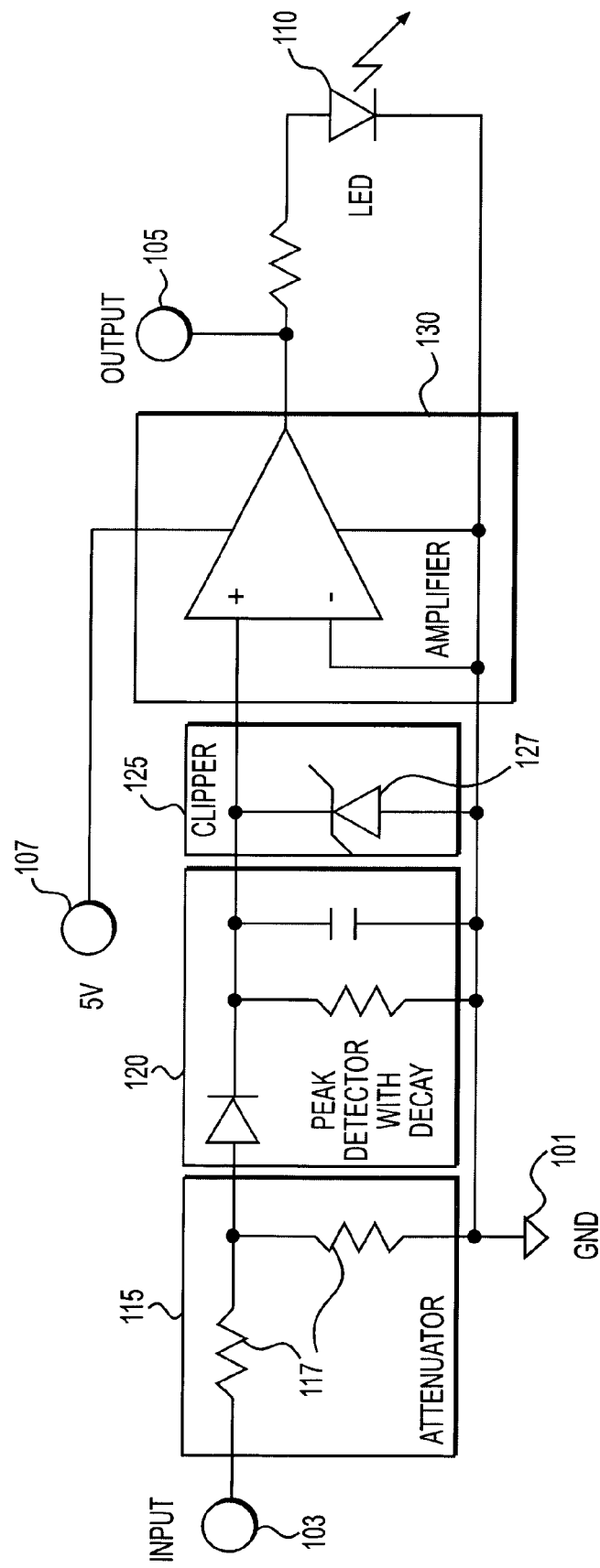
FIG. 2 is a simplified electrical schematic diagram of the exemplary high voltage sensor circuit of FIG. 1.

FIG. 2 is a simplified electrical schematic of the HVSC 100.

Considering FIGS. 1 and 2, attenuator 115 is capable of receiving hundreds and thousands of volts without breaking down or signal corruption. This is achieved by using high performance resistors 117 in a voltage divider network while accounting for device power dissipation requirements under the stress of applied high voltages. The transfer curve of the attenuator 115 is linear over its working input voltage range, up to thousands of volts, and may divide the input signal by a factor, such as 1000.

Peak detector 120 holds a peak input voltage output from the attenuator 115 for a predetermined amount of time, such as 1 ms, for example. The decay allows the peak detector 120 to recover after the decay time so that lower peak voltage values may be detected within the signal stream. The peak detector 120 also may be a signal envelope detector where the amplitude modulation of a carrier signal is passed and the carrier signal itself is filtered away. The peak detector 120 delivers an output proportional to the envelope magnitude of the incoming signal, provided that its carrier frequency is above the inverse of the decay time (1 ms translates to 1000 Hz). The peak detector 120 also is passive so that the peak detector 120 can withstand excessive input voltages passed by the attenuator 115 without breaking down.

Clipper 125 prevents signals passing through the attenuator 115 and peak detector 120 from reaching the active and sensitive electronics of linear amplifier 130. The clipping action may be accomplished via a non-linear device, such as a diode. In an embodiment, the clipper 125 uses a Zener diode 127.

The broadband linear amplifier 130 provides a signal strong enough to excite the LED 110. The output 105 of the amplifier 130 is also a convenient place from which the A/D converter 140 may be driven without the need for further signal conditioning provided that the voltage levels of the amplifier 130 and the A/D converter 140 are compatible.

The LED 110, if generating visible light, is a convenient visual indicator to a user that the coil of interest is efficiently transferring electromagnetic energy to the water within its proximity (such as passing through it). The LED 110 also may be part of a semiconductor opto-isolator device (not shown) used to convey the coil status to further electronic equipment, such as a remote status indicator, alarm system, or a performance assessor, for example.

Also shown in FIG. 1 is microprocessor-based coil excitation and drive circuit 160. The circuit 160 includes phase inverter 161, which takes a square wave signal out of the microprocessor 150 and inverts the signal. Drivers 163 and 165 then apply the square wave signals to coil 170. Voltage from driver 165 is first applied to capacitor 167. The application of the voltage signals to the capacitor 167 and the coil 170 generate an oscillating energy system where voltage builds to a peak power indicative of resonance in the coil 170 and the capacitor 167. In an embodiment, peak voltage can reach 800 volts or more.

Although FIG. 1 shows only one coil 170, additional coils could be used with the water treatment system. When additional coils are added, each such coil would have its own associated HVSC, A/D converter, and driver circuit.

For coils such as coil 170, to ensure resonance and energy efficiency, microprocessor 150 is programmed with specially designed software 151 that implements at least two modes or phases, namely the Scanning Phase and the Normal Run Phase. The Scanning Phase is used to drive the coil 170 with a series of frequencies over a broad spectrum while monitoring the A/D converter 140 to identify which frequency yields the greatest energy transfer as indicated by the highest voltage recorded during this frequency scan. The Normal Run Phase is used to drive the coil 170 at a frequency determined by the Scanning Phase while monitoring the magnitude of the A/D converter 140 to either adjust the frequency to regain a peak value or make assessments regarding the efficiency of energy transfer for the software 151 to handle accordingly, such as to auto-reset or indicate a warning, should energy transfer decrease significantly. The software 151 may incorporate the Scanning Phase once and sustain operation during the Normal Run Phase, or the Scanning Phase may be integrated into the Normal Run Phase or regular or integrated re-scanning and auto-adjusting.

As an alternative to software, the scanning and normal run functions may be implemented in a hardware device, or a combination of software and hardware.

Figure 3:
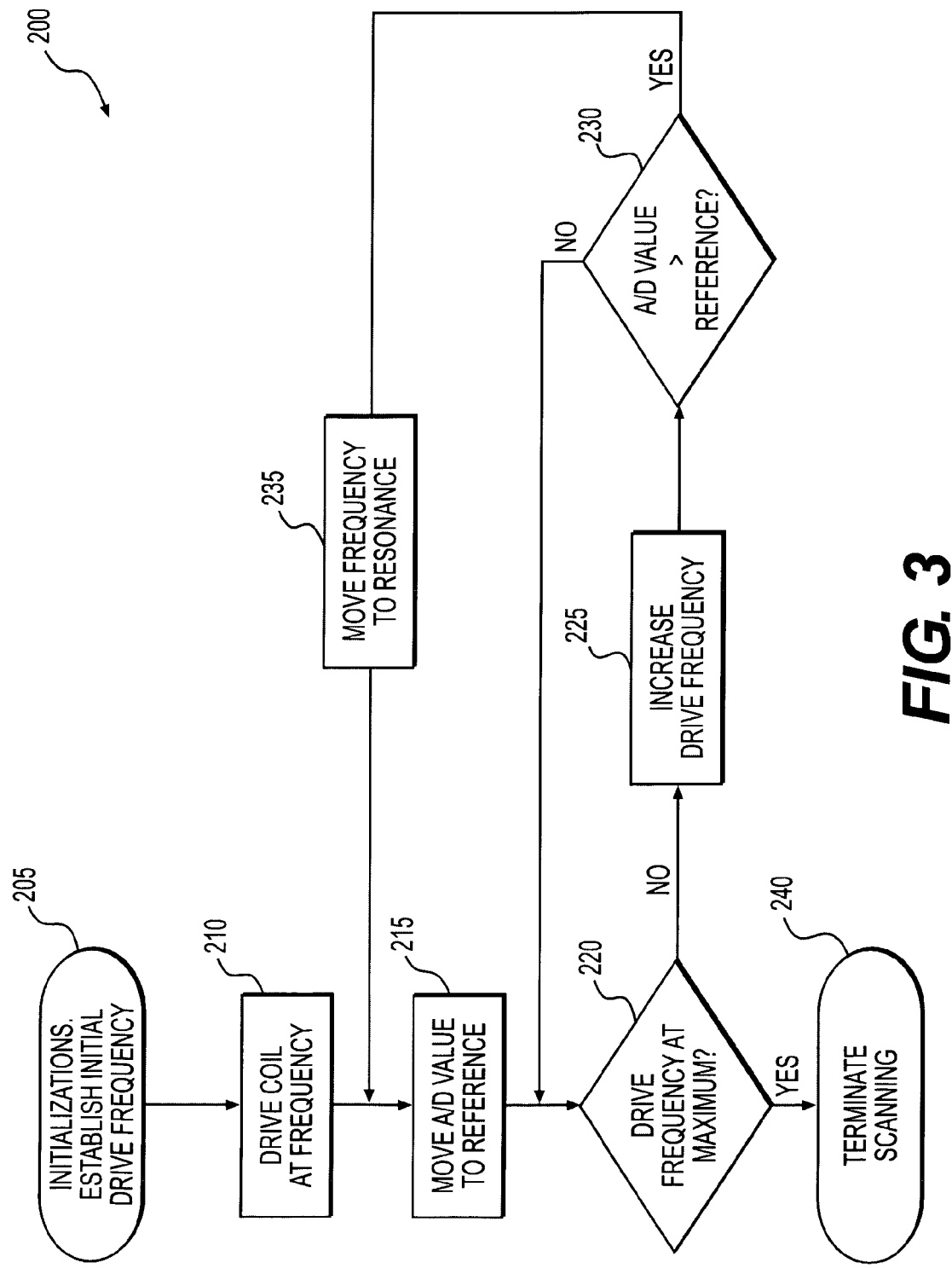
FIG. 3 is a flowchart illustrating an exemplary scanning phase operation of the microprocessor of FIG. 1.

FIG. 3 is a flowchart illustrating an exemplary Scanning Phase routine 200 performed under control of the microprocessor 150 of FIG. 1. The routine 200 begins, block 205, with basic initializations, such as clearing the prior values stored as the resonance frequency and the reference A/D converter value, and setting an initial coil drive frequency, such as 100 Hz, for example. In block 210, the initial coil drive frequency is applied to the coil 170. In blocks 215 through 235, for this initial coil drive frequency, and for subsequent frequencies, a corresponding A/D value is obtained by the microprocessor 150 through the HVSC 100. The A/D value then is stored in the memory 153 as a Reference value or compared to the Reference value and stored there if greater. Likewise, when a new A/D value is stored as the Reference value, the corresponding frequency also is stored separately. At the end of the routine 200, when scanning terminates, block 240, the stored frequency is that which is closest to peak of the natural resonance of the coil 170. This frequency is then used as the mean operating frequency for the Normal Run Phase of the microprocessor 150.

Figure 4:
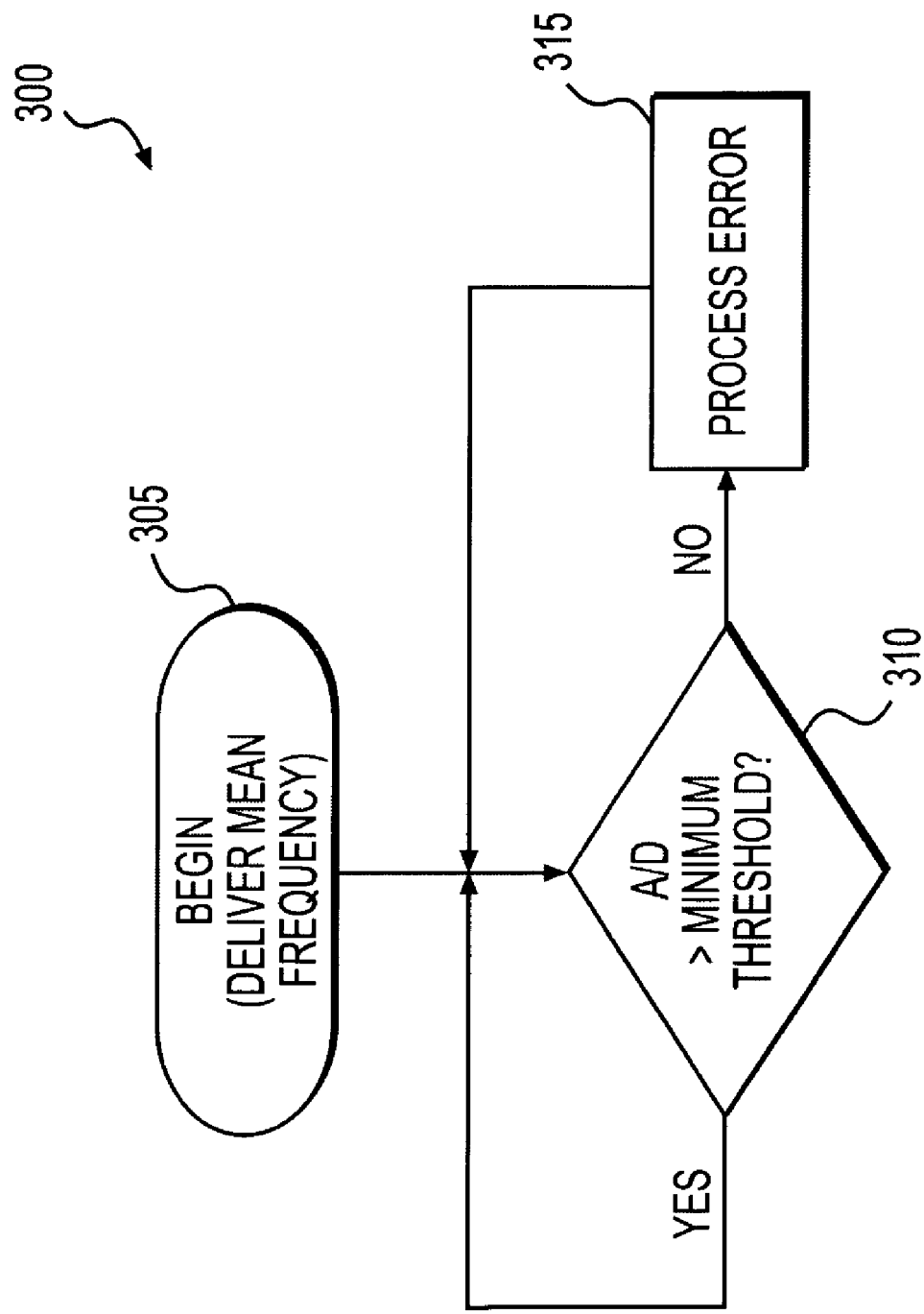
FIG. 4 is a flowchart illustrating an exemplary normal run phase operation of the microprocessor of FIG. 1.

FIG. 4 is a flowchart illustrating an exemplary Normal Run routine 300 executed by the microprocessor 150 of FIG. 1. In block 305 the microprocessor 150 sends a signal to the coil drive circuit 160 to generate a fixed frequency as determined during the Scanning routine 200. The output power of the A/D converter 140 is monitored by the HVSC 100, and if detected to drop below a threshold value (block 310), an error event is declared, block 315, which may be communicated to a human operator, terminating power, and recording the event, for example.

Figure 5:
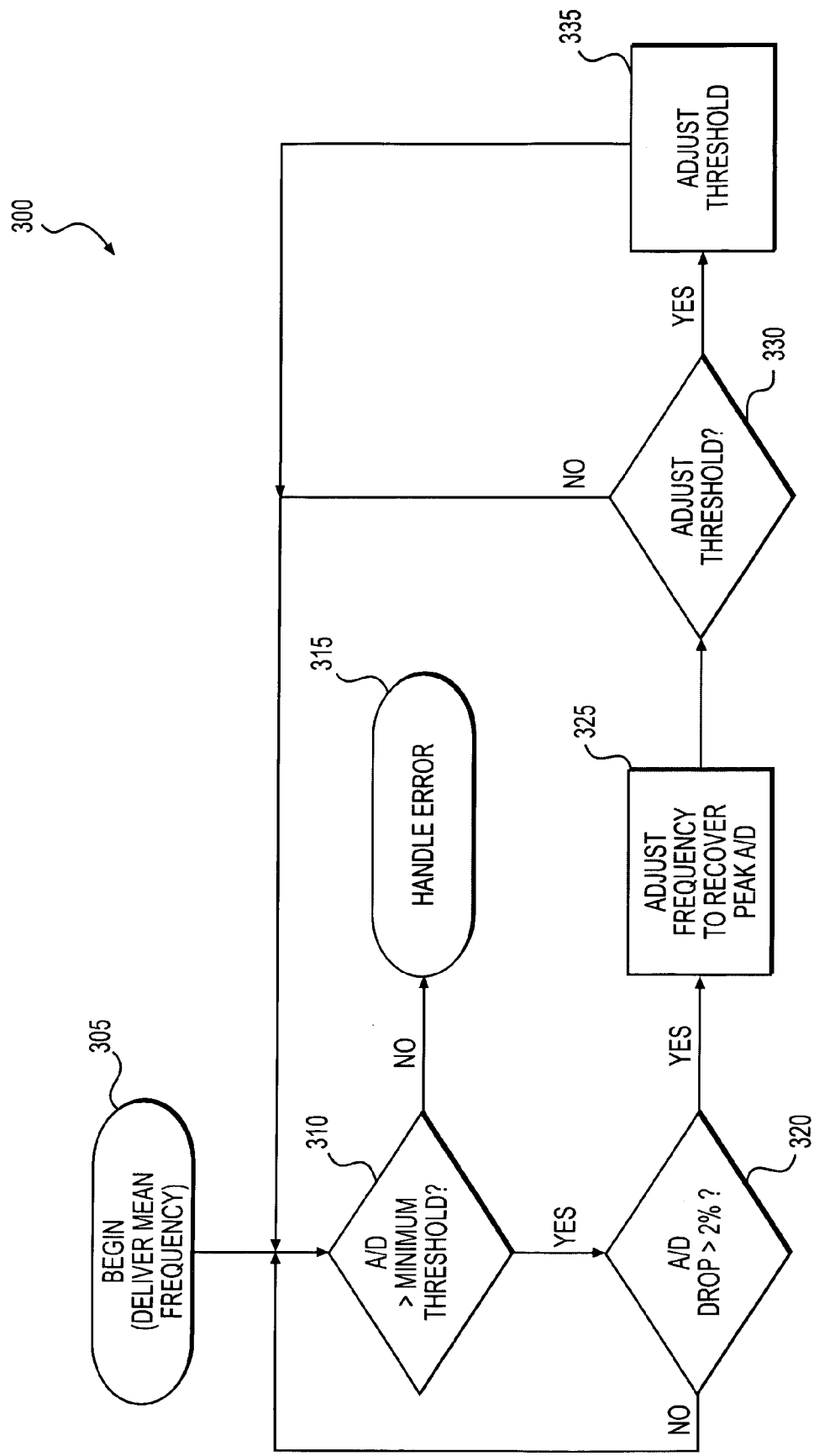
FIG. 5 is a flowchart illustrating an alternative normal run phase operation of the microprocessor of FIG. 1.

FIG. 5 is a flowchart illustrating an alternative Normal Run routine 300'. The routine 300' incorporates adjusting the frequency to match the new resonant frequency of the coil 170 if operation of the coil 170 has been affected due to age, temperature, water composition, etc. In this fashion, maximum power transfer can be maintained for much longer periods of time. This is accomplished by adjusting operational parameters using the HVSC 100 in real time. These parameters include the operating frequency, the expected power level from the HVSC 100, etc.

As shown in FIG. 5, in block 305 the microprocessor 150 sends a signal to the coil drive circuit 160 to generate a fixed frequency as determined during the Scanning routine 200. The output power of the A/D converter 140 is monitored by the HVSC 100, and if detected to drop below a threshold value (block 310), an error event is declared, block 315, which is communicated to a human operator, terminating power, and recording the event, for example. If, in block 310, the output power of the A/D converter 140 exceeds the minimum threshold vale, the routine 300' moves to block 320 and the microprocessor 150 determines if the power output of the A/D converter 140 has decreased by greater than 2 percent over its prior recorded value. If the decrease is greater than 2 percent, the routine 300' moves to block 325 and the microprocessor 150 adjusts the resonant frequency to match the power output of the A/D converter 140. Next, in blocks 330 and 335, the microprocessor 150 determines if the power output threshold for the A/D converter 140 should be adjusted, and if so, makes the adjustment.

Figure 6:
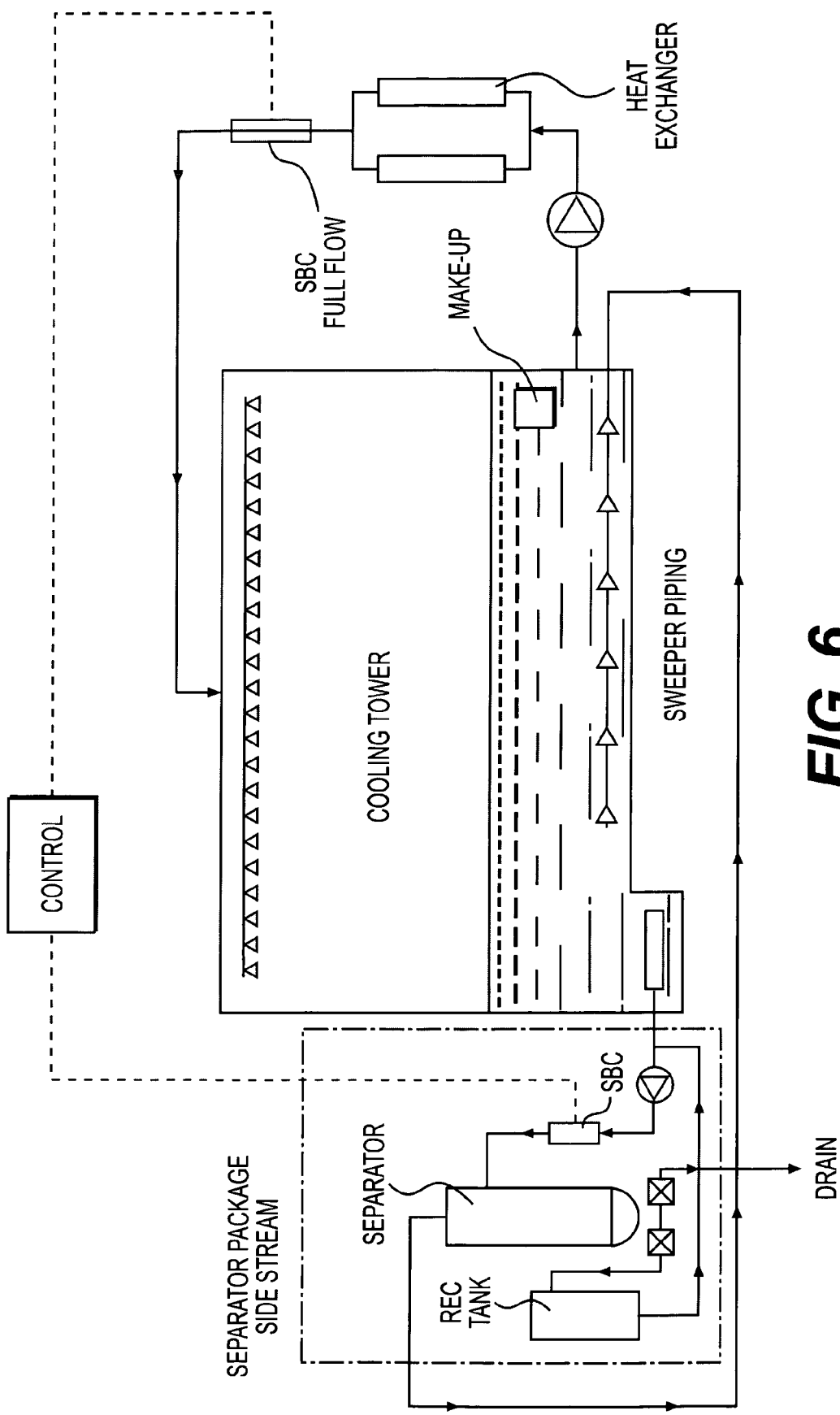
FIG. 6 is a schematic of a heat exchanger system incorporating a scale bacteria and corrosion controller with the high voltage sensor circuit of FIG. 1.

FIG. 6 illustrates a configuration of a system incorporating the SBCC.

The invention claimed is:

1. A microprocessor-controlled high voltage sensor circuit to control resonant operation of an induction coil—capacitor circuit, comprising:
   an input that receives a high voltage signal from the induction coil—capacitor circuit;
   an attenuator coupled to the input, wherein the attenuator reduces the high voltage signal to a low voltage signal;
   a peak detector coupled to the attenuator, the peak detector that holds the low voltage signal and detects a peak value of the low voltage signal;
   a clipper circuit that limits an output voltage from the peak detector so as to prevent damage to components of the high voltage sensor circuit; and
   a linear amplifier that receives the low voltage signal from the clipper circuit and amplifies the low voltage signal for detection of resonance conditions in the induction coil—capacitor circuit by a microprocessor coupled to the high voltage sensor circuit.

2. The circuit of claim 1, further comprising:
   a visual indication device coupled to the linear amplifier, wherein the visual indication devices provides a visual indication of a resonance condition.

3. The circuit of claim 2, wherein the visual indication device is a light emitting diode.

4. The circuit of claim 1, wherein the microprocessor comprises programming to determine an initial resonance frequency for the induction coil—capacitor circuit.

5. The circuit of claim 1, wherein the microprocessor comprises programming to determine a normal runtime resonance condition of the induction coil—capacitor circuit.

6. The circuit of claim 5, wherein the microprocessor further comprises programming to adjust an input voltage to the induction coil—capacitor circuit to adjust the normal runtime resonance condition.

7. The circuit of claim 1, wherein the high voltage sensor circuit provides an output voltage signal to an A/D converter, and wherein the microprocessor receives a converted signal from the A/D converter based on the output voltage supplied to the A/D converter.

8. A microprocessor controlled self-tuning high voltage control circuit, the circuit controlling resonant operation of an induction coil—capacitor circuit, comprising:
   means for reading a high voltage output of the induction coil—capacitor circuit;
   means for reducing the high voltage output to a low voltage output;
   means for holding the low voltage output and for detecting a peak value of the low voltage output;
   means for limiting an output voltage from the detecting means so as to prevent damage to components of the high voltage control circuit; and
   means for receiving the low voltage output from the limiting means and for amplifying the low voltage output for detection of resonance conditions in the induction coil—capacitor circuit by a microprocessor coupled to the high voltage control circuit.

9. The microprocessor controlled self-tuning high voltage control circuit of claim 8, further comprising:
   means for indication to a user when the induction coil—capacitor circuit is operating at the resonant condition.

10. The microprocessor controlled self-tuning high voltage control circuit of claim 8, wherein the microprocessor provides an output square wave to drive the induction coil—capacitor circuit.

11. The microprocessor controlled self-tuning high voltage control circuit of claim 8, further comprising:

means for establishing an initial resonant frequency for operation of the induction coil—capacitor circuit; and means for monitoring normal running of the induction coil—capacitor circuit to maintain the resonant condition.

12. The microprocessor controlled self-tuning high voltage control circuit of claim 11, further comprising:

means for adjusting the frequency of the induction coil—capacitor circuit during the normal running operation.

13. The microprocessor controlled self-tuning high voltage control circuit of claim 8, further comprising means for indication an error condition when the induction coil—capacitor circuit operates outside the resonant condition.

\* \* \* \* \*